United States Patent
Ryker et al.

(10) Patent No.: US 7,739,064 B1
(45) Date of Patent: Jun. 15, 2010

(54) INLINE CLUSTERED DEFECT REDUCTION

(75) Inventors: Gregory G. Ryker, Ben Lomond, CA (US); Venkata R. Griddalur, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1276 days.

(21) Appl. No.: 10/434,856

(22) Filed: May 9, 2003

(51) Int. Cl.
 *G01R 31/00* (2006.01)
(52) U.S. Cl. ............... 702/81; 702/118; 702/182; 700/121
(58) Field of Classification Search .......... 702/81–84, 702/159, 182, 35, 183, 118; 700/110, 121, 700/109; 257/48; 438/15; 250/548, 234; 355/53; 324/500
See application file for complete search history.

(56) References Cited

U.S. PATENT DOCUMENTS

| | | | | |
|---|---|---|---|---|
| 4,644,172 A | * | 2/1987 | Sandland et al. | 250/548 |
| 6,154,714 A | * | 11/2000 | Lepejian | 702/118 |
| 6,202,037 B1 | * | 3/2001 | Hattori et al. | 702/182 |
| 6,498,685 B1 | * | 12/2002 | Johnson | 359/626 |
| 6,553,323 B1 | * | 4/2003 | Obara et al. | 702/35 |
| 6,576,919 B1 | * | 6/2003 | Yoshida | 250/548 |
| 6,618,850 B2 | * | 9/2003 | Nishiyama et al. | 716/20 |
| 6,628,818 B1 | * | 9/2003 | Nakano et al. | 382/149 |
| 6,653,024 B1 | * | 11/2003 | Shiraishi et al. | 430/5 |
| 6,741,941 B2 | * | 5/2004 | Obara et al. | 702/35 |
| 6,751,514 B2 | * | 6/2004 | Ando | 700/109 |
| 2005/0194590 A1 | * | 9/2005 | Matsushita et al. | 257/48 |

OTHER PUBLICATIONS

Matshushita et al.,Highly Sensitive Inspection System for Lithography-Related Faults in Agile-Fab-Detecting Algorithm for Monitoring and Evaluation of Yield Impact, vol. 15, No. 4, Nov. 2002.*
Matsushita et al., New Method of Classification System for Wafer Mapsl Proceedings of ISSM (2004), pp. 482-485.*

* cited by examiner

*Primary Examiner*—Drew A Dunn
*Assistant Examiner*—Hien X Vo
(74) *Attorney, Agent, or Firm*—Luedeka, Neely & Graham, P.C.

(57) ABSTRACT

A method of reducing an inspection time required for inspecting a wafer with an automated inspection system. A target time is determined, to which the inspection time is to be reduced. A maximum number of analyses that the automated inspection system can perform during the target time is determined, and analysis of the wafer is limited to the maximum number of analyses, thereby enabling the automated inspection system to reduce the inspection time required to inspect the wafer to the target time. In this manner, the length of time required to inspect the wafer with the automated inspection system does not exceed the target time, because the number of inspections that can be performed within the target time has been determined. Thus, the inspection time for each wafer is kept to a desired level.

8 Claims, 2 Drawing Sheets

INLINE CLUSTERED DEFECT REDUCTION

FIELD

This invention relates to the field of inspection instrumentation. More particularly, this invention relates to increasing the speed at which defects on a sample are classified, without unduly sacrificing the accuracy of such defect classification.

BACKGROUND

The integrated circuit fabrication industry relies on the continual and repeated inspection of the integrated circuits as they are produced to ensure that processes are operating properly and that the integrated circuits themselves are properly formed. Such inspections can be generally divided into two different categories, being inline inspections and final inspections. Inline inspections are performed during the fabrication process, such as just after a critical step in the process is performed. In this manner, information can be fed back to the process in a timely manner, to ensure that subsequent products in the pipeline are not processed incorrectly. Final inspections are typically performed at the end of the fabrication process, and although they too may provide some valuable information in regard to the proper operation and control of the fabrication processes, they are primarily designed to ensure that the finished integrated circuits are functional and free of defects prior to packaging and sale.

Years ago, inspection steps were performed manually, and trained inspectors loaded a wafer on which the integrated circuits are formed under a microscope, and carefully scanned across the surface of the wafer, looking for defects. This system, of course, had many drawbacks. For example, different operators would interpret different wafer characteristics as defects, and thus there was a problem with inspection uniformity. In addition, even a well trained operator may have a momentary lapse of attention, and miss an important defect. Finally, even under the best of conditions, manual inspection for defects became too time consuming.

For these and other reasons, automated inspection became the preferred method of inspecting integrated circuits. Automated inspection solved the problem of non-uniformity between different inspectors, because the automated inspection tools could run from the same software routines. Further, automated inspection tools do not have momentary lapses in the same manner that human inspectors did. Finally, for the most part, automated inspection tools were much faster than their human counterparts. Thus, automated inspection has traditionally worked well for the integrated circuit fabrication industry.

However, as automated inspection has evolved in the wake of ever more complicated integrated circuits, there has been continual pressure to detect and classify a growing number of defects and other conditions that may be present on the wafer. Thus, a heavier load has been placed on automated inspection than was ever conceivable for to manual inspection. This situation is amplified by the fact that fabs are producing more and more integrated circuits so as to reduce the overhead costs associated with production, and to satisfy the demands of the modern world. Such conditions have resulted in a desire to reduce the time associated with automated inspection.

What is needed, therefore, is a system by which the time required to inspect a wafer can be reduced without unduly reducing the accuracy of the inspection.

SUMMARY

The above and other needs are met by a method of reducing an inspection time required for inspecting a wafer with an automated inspection system. A target time is determined, to which the inspection time is to be reduced. A maximum number of analyses that the automated inspection system can perform during the target time is determined, and analysis of the wafer is limited to the maximum number of analyses, thereby enabling the automated inspection system to reduce the inspection time required to inspect the wafer to the target time.

In this manner, the length of time required to inspect the wafer with the automated inspection system does not exceed the target time, because the number of inspections that can be performed within the target time has been determined. Thus, the inspection time for each wafer is kept to a desired level.

In various preferred embodiments, the target time is the time required to load the wafer into the automated inspection system and to scan the wafer with the automated inspection system. Preferably, the step of limiting the analysis of the wafer to the maximum number of analyses includes discarding analysis of defects when a number of defects on the wafer is greater than the maximum number of analyses. The step of limiting the analysis of the wafer to the maximum number of analyses preferably includes discarding analysis of defects on the wafer that are within a selectable cluster radius of a previously analyzed defect on the wafer.

According to another aspect of the invention, there is described an automated inspection system adapted to reduce an inspection time required for inspecting a wafer. The automated inspection system includes an interface adapted to selectively enable an inspection time reduction routine. An inspection tool senses defects on the wafer and tallies a number of the defects, and a processor determines spatial locations of the defects. A memory holds the number of the defects in a pending defect count and the spatial locations of the defects in a pending defect queue. A first logical module compares the pending defect count to a maximum defect queue size, which is related to a maximum number of analyses that the automated inspection system can perform during a target time required to load and scan the wafer with the automated inspection tool. A second logical module bins the defects into configurable cells.

A third logical module sends defects to an image classification server for defect classification. A fourth logical module compares spatial locations of the defects and determines whether a given one of the defects is within a selectable cluster radius of a defect that has already been sent to the image classification server for defect classification. A fifth logical module selectively discards the given one of the defects when the inspection time reduction routine is enabled and the given defect is within the cluster radius. A sixth logical module selectively discards the given defect when the inspection time reduction routine is enabled and the pending defect count is greater than the maximum defect queue size A seventh logical module sends the given defect through the third logical module to the image classification server for defect classification if the given defect is not within the cluster radius and the pending defect count is not greater than the maximum defect queue size. The image classification server analyzes and classifies the defect.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
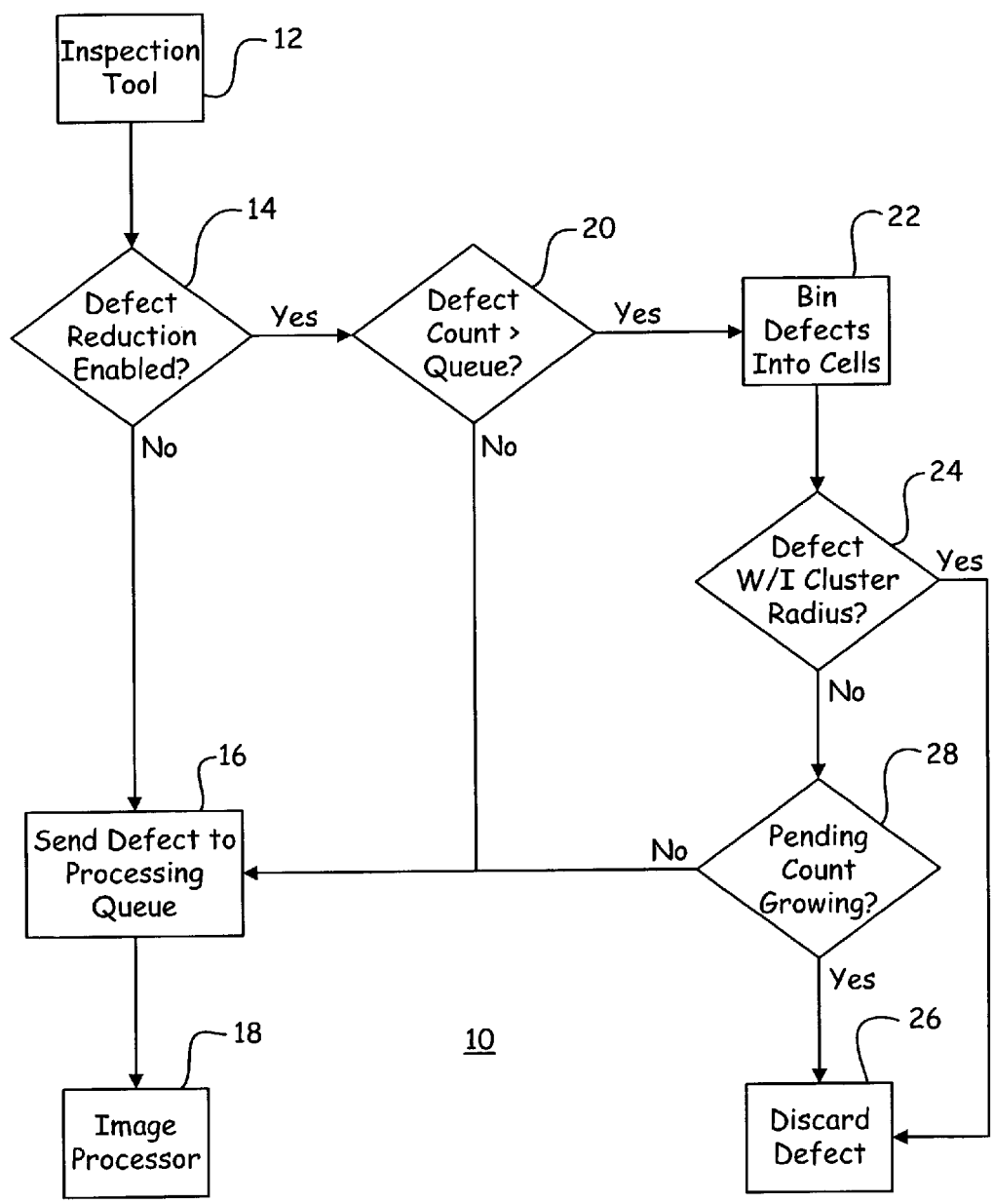
FIG. 1 is a flow chart of the method according to a preferred embodiment of the present invention.

With reference now to FIG. 1, there is depicted a flow chart of the method 10 according to a preferred embodiment of the present invention. The method 10 as described herein operates on data that is generated such as by an inspection tool 12, which in the preferred embodiment is a visual inspection tool such as a scanning electron microscope. It is appreciated that the method 10 can be used either off-line, such as with archived data from the inspection tool 12, but is more preferably used on-line, in real time as the inspection tool 12 is operating and generating the data.

As the inspection tool 12 generates data for analysis, it is determined whether the defect analysis reduction system as described herein is enabled, as given in block 14. If the reduction system is not enabled, then logical flow of the method proceeds to block 16, with the defect information generated by the inspection tool 12 being sent to a processing queue 16 to await defect analysis by an image processor 18. The image processor 18 analyzes the defect information, and based upon a predetermined set of rules—or on rules developed in real time, assigns a defect classification to the defect reported by the inspection tool 12 and represented by the defect data.

As previously mentioned, because of the number of different defects that can be classified in this manner, and the continuing desire to add an ever greater number of such classifications, defect analysis by the image processor 18 tends to be a rate limiting step in the overall process of automated inspection. In other words, the inspection tool 12 tends to be able to generate a far greater amount of information in a given length of time than the image processor 18 can analyze. Thus, according to the present invention, it is desired to reduce in some sensible manner the amount of defect information that is sent to the image processor 18 from the inspection tool 12.

Therefore, if the defect analysis reduction system is enabled, as queried in block 14, then program control flows to the next decision block 20. In decision block 20 it is determined whether the defect count received from the inspection tool 12 is greater than the target queue value. The target queue value is a limitation that is placed on the number of defect analyses that will be performed by the image processor 18. Although it could be a somewhat arbitrarily set value, in the preferred embodiment the target queue value is based at least in part on the principles of providing the greatest possible degree of defect analysis within a length of time that does not unduly extend the total time required to inspect a single wafer with the inspection tool 12 and provide an analysis of the analyzed defects on the wafer with the image processor 18.

In the most preferred embodiment, this total length of time is set as about equal to the length of time required by the inspection tool 12 to load and scan a wafer. Thus, any analysis performed by the image processor 18 is preferably held to that same length of time. Therefore, as fast as the inspection tool 12 can load and scan a new wafer, a defect analysis, such as for the previous wafer, can be produced. In this manner the system 10 operates without bogging down as a result of undue analysis of defects. However, it is preferred that the defect information, if there is more defect information than can be analyzed in the given amount of time, be selectively discarded, rather than randomly or haphazardly discarded.

Thus, in block 20, the amount of data to be analyzed is preferably compared to the total number of analyses that can be performed in the target time, which in the preferred embodiment is the length of time required to load and scan a wafer in the inspection tool 12. If the amount of data generated is less than this target queue amount of data, then program control flows again to block 16, and the defect data is all sent to the processing queue to await analysis by the image processor 18. Such a situation may occur, for example, when there are very few defects on a given wafer. In such a situation, where all of the data can be analyzed and the defects characterized in no more time than it takes to load and scan a wafer, there is no need, from the standpoint of saving time, to reduce the amount of analysis to be performed by the image processor 18.

However, in the event that there are a greater number of defects to be analyzed than can be processed by the image processor 18 during the target time, then program control preferably flows to block 22. In block 22, the defects are binned into geographical cells based on their physical location on the wafer. This binning process is preferably accomplished independently of the device size on the wafer. For example, the defects may be binned into cells, where each cell represents one square centimeter on the surface of the wafer. After the binning process, program flow control proceeds to decision block 24.

Decision block 24 is the heart of the defect reduction system 10, in that it is the portion where defect data is selectively discarded. This decision can be made based upon a number of different factors and criteria. For example, if a defect has been identified that is of the type for which the entire wafer will be discarded, then further analysis of any other defects on the wafer can be curtailed. However, in the preferred embodiment, the criteria that is used to selectively pass defect data on to analysis and to selectively discard defect data is the physical location on the wafer from which the defect data is gathered.

Thus, decision block 24 looks at the binning information from block 22 that is associated with the defect information, to determine whether the defect information currently being reviewed is within a given cluster radius of defect information that has already been passed on for analysis. As defects within a relatively small radius tend to be increasingly related one to another, there is less value in analyzing all of the defect data within the relatively small radius, because it all tends to indicate the same defect. Thus, one method of selectively reducing the amount of defect data to be analyzed is to selectively discard defect data that has a high probability of containing defect results that are likely to be repetitive of defect data that has already been analyzed, or is already in the processing queue 16 awaiting analysis.

Thus, data that is associated with binning information that is within the cluster radius of a previously analyzed or queued data is preferably discarded, as given in block 26, while defect data that is not within the cluster radius as determined in decision block 24 is preferably passed along to block 28 for further logical processing.

It is appreciated that the size of the cluster radius can be selectively set, based on one or more of several different criteria. For example, empirical studies can be performed which look at the cluster radius of various defects, and a cluster radius can be derived from the empirical studies. Alternately, the cluster radius can be set based on the desires of the engineer overseeing the project. Perhaps at one given time it is desired to trade a relative increase in processing time for a smaller cluster radius, and analyze a greater percentage of the defect information. At another time it may be desired to trade a to relative decrease in processing time for a larger cluster radius, and analyze a lesser percentage of the defect information.

In one embodiment, the cluster radius is derived in real time, based upon the amount of data that has been sent to the processing queue, and whether the image processor 18 will be able to analyze the queued data within the target time. For example, if there are relatively few defects on the wafer, but enough to engage this portion of the defect reduction system from decision block 20, the system 10 may reduce the cluster radius so that a greater percentage of the defects are analyzed, because it is anticipated, based on the number of defects, that there will be time to analyze the queued defects. However, if there are relatively many defects on the wafer, the system 10 may increase the cluster radius so that a lesser percentage of the defects are analyzed, because it is anticipated, based on the number of defects, that there will not be time to analyze an increased number of defects.

In a most preferred embodiment, each cell keeps a list of defects that fall within that cell. For each defect, the defect reduction system 10 preferably searches within the appropriate cell to determine whether the defect falls within the cluster radius of a defect within the same cell. In alternate embodiments, the search includes the cluster radii of defects that are not with the same cell. If the defect is not within the cluster radius, then the defect may added to the list of defects to be analyzed for that cell, as described below. In one embodiment, the list length for defects to be analyzed for a given cell cannot exceed a certain value, and any defects in excess of that number are discarded as given in block 26.

If the defect in question is not discarded, because it is not within the cluster radius, then program control flows next to block 28. Block 28 is a final gate or failsafe for the data flowing in this branch of the system to the processing queue 16. Decision block 28 discards any data if the data pending in the processing queue 16 is growing at a rate whereby the image processor 18 will not have time to analyze the data within the target time. Thus, even if the defect data is from a portion of the wafer that is outside of the cluster radius of anything else that has already been queued or analyzed, decision block 28 will discard the defect data if there just will not be time to analyze it within the target time. However, if the processing queue is sufficiently short, such that the image processor 18 will be able to process the information within the target time, then decision block 28 sends the data to the processing queue 16, pending analysis by the image processor 18.

Figure 2:
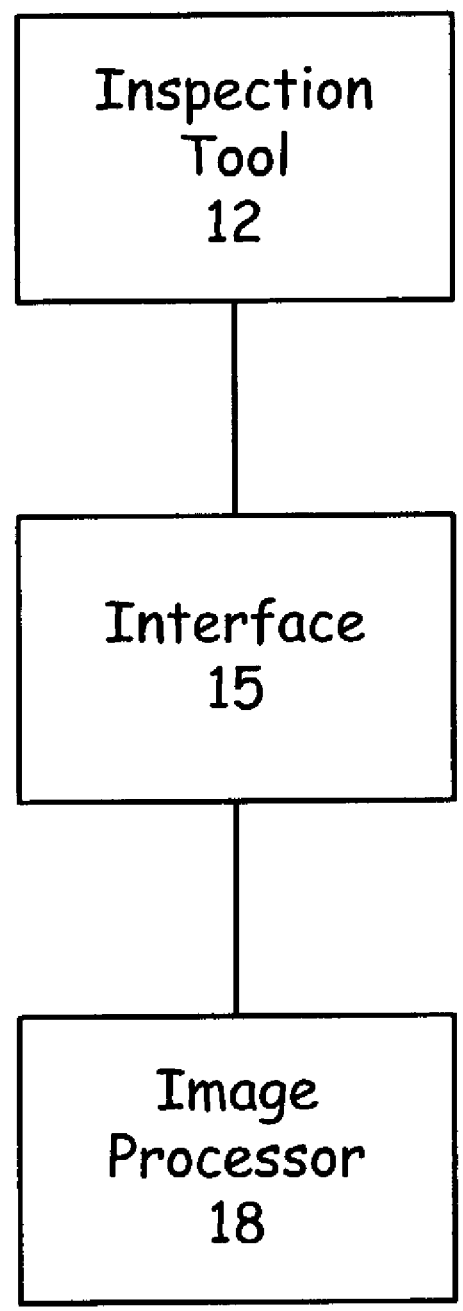
FIG. 2 is a functional block diagram of an apparatus according to a preferred embodiment of the present invention.

FIG. 2 provides a functional block diagram of the system according to the present invention, including the inspection tool 12, the software data interface 15, and the image processor 18. The Interface 15 contains physical processing elements and logical module elements sufficient to carry out the steps as depicted in FIG. 1 between the inspection tool 12 and the image processor 18. It is appreciated that in some embodiments the elements 12, 15, and 18 may all reside within the same hardware platform, and that in other embodiments the elements 12, 15, and 18 may all reside within separate hardware platforms, and be separated one from another, but in communication one with another such as via a computer network. In a most preferred embodiment, the interface 15, wherein all the defect reduction system is preferably embodied, resides on the same hardware platform as the inspection tool 12, so that only that data which needs to be analyzed is transferred from one hardware platform to another.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A processor-based method of reducing an inspection time required for inspecting a wafer with an automated inspection system, the method comprising the steps of:
   determining a target time to which the inspection time is to be reduced,
   using the processor, determining a maximum number of analyses that the automated inspection system can perform during the target time, and
   limiting analysis of the wafer to the maximum number of analyses, thereby enabling the automated inspection system to reduce the inspection time required to inspect the wafer to the target time.

2. The method of claim 1, wherein the target time is the time required to load the wafer into the automated inspection system and to scan the wafer with the automated inspection system.

3. The method of claim 1, wherein the step of limiting the analysis of the wafer to the maximum number of analyses comprises discarding analysis of defects when a number of defects on the wafer is greater than the maximum number of analyses.

4. The method of claim 1, wherein the step of limiting the analysis of the wafer to the maximum number of analyses comprises discarding analysis of defects on the wafer that are within a selectable cluster radius of a previously analyzed defect on the wafer.

5. A processor-based method of reducing an inspection time required for inspecting a wafer with an automated inspection system, the method comprising the steps of:
   determining a target time required to load the wafer into the automated inspection system and to scan the wafer with the automated inspection system,
   using the processor, determining a maximum number of analyses that the automated inspection system can perform during the target time, and
   limiting analysis of the wafer to the maximum number of analyses, thereby enabling the automated inspection system to reduce the inspection time required to inspect the wafer to the target time required to load and scan the wafer.

6. The method of claim 5, wherein the step of limiting the analysis of the wafer to the maximum number of analyses comprises discarding analysis of defects when a number of defects on the wafer is greater than the maximum number of analyses.

7. The method of claim 5, wherein the step of limiting the analysis of the wafer to the maximum number of analyses comprises discarding analysis of defects on the wafer that are within a selectable cluster radius of a previously analyzed defect on the wafer.

8. An automated inspection system adapted to reduce an inspection time required for inspecting a wafer, the automated inspection system comprising:

- an interface adapted to selectively enable an inspection time reduction routine,
- an inspection tool adapted to sense defects on the wafer and to tally a number of the defects,
- a processor for determining spatial locations of the defects,
- a memory for holding the number of the defects in a pending defect count and the spatial locations of the defects in a pending defect queue,
- a first logical module adapted to compare the pending defect count to a maximum defect queue size, where the maximum defect queue size is related to a maximum number of analyses that the automated inspection system can perform during a target time required to load the wafer into the automated inspection tool and to scan the wafer with the automated inspection tool,
- a second logical module adapted to bin the defects into configurable cells,
- a third logical module adapted to send defects to an image classification server for defect classification,
- a fourth logical module adapted to compare spatial locations of the defects and to determine whether a given one of the defects is within a selectable cluster radius of a defect that has already been sent to the image classification server for defect classification,
- a fifth logical module adapted to selectively discard the given one of the defects when the inspection time reduction routine is enabled and the given defect is within the cluster radius,
- a sixth logical module adapted to selectively discard the given defect when the inspection time reduction routine is enabled and the pending defect count is greater than the maximum defect queue size,
- a seventh logical module adapted to send the given defect through the third logical module to the image classification server for defect classification if the given defect is not within the cluster radius and the pending defect count is not greater than the maximum defect queue size, and
- the image classification server further adapted to analyze and classify the defect.

* * * * *